United States Patent
Ahn et al.

(10) Patent No.: US 7,602,042 B2
(45) Date of Patent: Oct. 13, 2009

(54) NONVOLATILE MEMORY DEVICE, ARRAY OF NONVOLATILE MEMORY DEVICES, AND METHODS OF MAKING THE SAME

(75) Inventors: Seung-Eon Ahn, Seoul (KR); In-Kyeong Yoo, Suwon-si (KR); Young-Soo Joung, Seoul (KR); Young-Kwan Cha, Yongin-si (KR); Myoung-Jae Lee, Suwon-si (KR); David Seo, Yongin-si (KR); Sun-Ae Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/270,459

(22) Filed: Nov. 10, 2005

(65) Prior Publication Data

US 2006/0098472 A1   May 11, 2006

(30) Foreign Application Priority Data

Nov. 10, 2004   (KR) .................... 10-2004-0091497

(51) Int. Cl.
*H01L 23/62* (2006.01)

(52) U.S. Cl. .................. 257/530; 257/529; 257/350; 257/358

(58) Field of Classification Search ................ 365/158; 257/529, 530, 350, 358
See application file for complete search history.

(56) References Cited

U.S. PATENT DOCUMENTS

| | | | |
|---|---|---|---|
| 3,705,419 A | 12/1972 | Bleher et al. | |
| 3,796,926 A | 3/1974 | Cole et al. | |
| 5,640,343 A | 6/1997 | Gallagher et al. | |
| 6,194,746 B1 * | 2/2001 | Gonzalez et al. | 257/104 |
| 6,627,100 B2 * | 9/2003 | Ando et al. | 252/62.3 ZB |
| 6,773,977 B1 * | 8/2004 | Reynes et al. | 438/237 |
| 6,849,564 B2 * | 2/2005 | Hsu et al. | 438/800 |
| 6,850,432 B2 * | 2/2005 | Lu et al. | 365/163 |
| 6,864,522 B2 * | 3/2005 | Krieger et al. | 257/296 |
| 7,009,694 B2 * | 3/2006 | Hart et al. | 365/163 |

(Continued)

FOREIGN PATENT DOCUMENTS

EP    0 666 593    2/1995

(Continued)

OTHER PUBLICATIONS

"ZnO diode fabricated by excimer-laser doping" Toru Aoki, Yoshinori Hatanaka, and David C. Look, Appl. Phys. Lett. 76, 3257-3258 (May 29, 2000).*

(Continued)

*Primary Examiner*—Anh Phung
*Assistant Examiner*—Allison P Bernstein
(74) *Attorney, Agent, or Firm*—Harness, Dickey & Pierce, PLC

(57) ABSTRACT

A nonvolatile memory device including a lower electrode, a resistor structure disposed on the lower electrode, a diode structure disposed on the resistor structure, and an upper electrode disposed on the diode structure. A nonvolatile memory device wherein the resistor structure includes one resistor and the diode structure includes one diode. An array of nonvolatile memory devices as described above.

21 Claims, 3 Drawing Sheets

U.S. PATENT DOCUMENTS

| | | | |
|---|---|---|---|
| 7,053,406 B1 * | 5/2006 | Ho et al. | 257/50 |
| 2002/0177292 A1 * | 11/2002 | Dennison | 438/587 |
| 2003/0179633 A1 | 9/2003 | Krieger et al. | |
| 2003/0189851 A1 | 10/2003 | Brandenberger et al. | |
| 2004/0159835 A1 | 8/2004 | Krieger et al. | |
| 2004/0202041 A1 * | 10/2004 | Hidenori | 365/233 |
| 2005/0170971 A1 * | 8/2005 | Yata et al. | 505/100 |
| 2006/0034116 A1 * | 2/2006 | Lam et al. | 365/151 |

FOREIGN PATENT DOCUMENTS

| | | |
|---|---|---|
| EP | 1 484 799 | 12/2004 |
| WO | WO 00/63981 | 10/2000 |
| WO | WO 02/095832 | 11/2002 |

OTHER PUBLICATIONS

Office Action and English Translation Thereof Issued in Corresponding Korean Application No. 10-2004-0091497 Dated Mar. 28, 2006.

European Search Report dated Nov. 6, 2008.

* cited by examiner

US 7,602,042 B2

NONVOLATILE MEMORY DEVICE, ARRAY OF NONVOLATILE MEMORY DEVICES, AND METHODS OF MAKING THE SAME

PRIORITY STATEMENT

This application claims the benefit of Korean Patent Application No. 10-2004-0091497, filed on Nov. 10, 2004, in the Korean Intellectual Property Office, the disclosure of which is incorporated herein in its entirety by reference.

BACKGROUND OF THE INVENTION

1. Field of the Invention

Example embodiments of the present invention relate to a nonvolatile memory device, an array of nonvolatile memory devices, and methods of making the same.

2. Description of the Related Art

Recently, studies have been made on semiconductor memory device that increase the number of memory cells per area (e.g., integration density), increase operating speed, and/or that can be driven with lower power.

In general, a semiconductor memory device may include many memory cells that are connected through circuits. In a dynamic random access memory (DRAM), which is a representative semiconductor memory device, a unit memory cell may be comprised of one switch and one capacitor. Such a DRAM may be advantageous due to its high integration density and/or fast operating speed. However, when the power supply is cut off, a DRAM loses all stored data.

By comparison, some nonvolatile memory devices, for example, a flash memory device, can retain stored data even if power supply is interrupted. Although a flash memory device may have a nonvolatile characteristic, it may also have lower integration density and/or slower operating speed than a volatile memory device.

Several nonvolatile memory devices, for example, a magnetic random access memory (MRAM), a ferroelectric random access memory (FRAM), and a phase-change random access memory (PRAM) are currently under study.

An MRAM stores data using a change of magnetization direction in a tunnel junction and an FRAM stores data using a polarization direction of a ferroelectric material. Although MRAMs and FRAMs have advantages and disadvantages, they both basically have higher integration density, faster operating speed, and/or can be driven with lower power as described above. Research is also being carried out to improve the data retention characteristic of MRAMs and FRAMs.

A PRAM may store data using one or more of a material's characteristic, namely, a variation in resistance with respect to a phase change. A PRAM may include one resistor and one switch (transistor). The resistor used for the PRAM may be a chalcogenide resistor, which may change from a crystalline state to an amorphous (and vice versa) according to a temperature that is controlled when the resistor is formed. A PRAM may be based on the principle that a crystalline resistor is typically more resistive than an amorphous resistor. In fabricating a PRAM using a conventional DRAM process, performing an etch process may become more complicated and/or takes more time. Accordingly, the productivity of such memory devices may decrease and/or the cost of production may increase, thus weakening the competitiveness of the devices.

SUMMARY OF THE INVENTION

Example embodiments of the present invention provide a nonvolatile memory device including one resistor and one diode, which may be fabricated in a simpler process, can be driven with lower power, and/or has a faster operating speed.

According to an example embodiment of the present invention, there is provided a nonvolatile memory device. The device may include a lower electrode, a resistor structure disposed on the lower electrode, a diode structure disposed on the resistor structure, and an upper electrode disposed on the diode structure.

In an example embodiment, the resistor structure may include a buffer layer disposed on the lower electrode and a data storage layer disposed on the buffer layer.

In an example embodiment, the resistor structure may be formed of at least one of NiO, $TiO_2$, HfO, ZrO, ZnO, $WO_3$, CoO, and $Nb_2O_5$. In an example embodiment, the amount of oxygen in the material of the resistor structure may be varied.

In an example embodiment, the diode structure may include a first oxide layer disposed on the resistor structure and a second oxide layer disposed on the first oxide layer. In an example embodiment, the first oxide layer may be formed of p-type oxide and the second oxide layer may be formed of n-type oxide.

According to another example embodiment of the present invention, there is provided an array of a nonvolatile memory device. The array may include at least two bit lines arranged at regular intervals, at least two word lines arranged at regular intervals and disposed across the bit lines, a resistor structure disposed on the bit lines at each of the intersections of the bit lines and word lines, and a diode structure disposed in contact with the resistor structure and the word lines.

In example embodiments, a nonvolatile memory device may include one resistor and one diode. In other example embodiments, an array of nonvolatile memory device may include multiple nonvolatile memory devices with one resistor and one diode.

According to another example embodiment of the present invention, there is provided a method of manufacturing a nonvolatile memory device including forming a lower electrode on a substrate, forming a resistor structure on the lower electrode, forming a diode structure on the resistor structure, and forming an upper electrode on the diode structure.

According to another example embodiment of the present invention, there is provided a method of manufacturing an array of nonvolatile memory devices including forming at least two bit lines on a substrate, arranged at regular intervals, forming one or more resistor structures on the at least two bit lines at desired locations, forming a diode structure on each of the one or more resistor structures, and forming at least two word lines arranged at regular intervals and disposed across the at least two bit lines; the at least two bit lines and the at least two word lines intersecting at the desired locations, the at least two bit lines and the at least two word lines being electrically connected via the one or more resistor and diode structures.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS OF THE INVENTION

Figure 1A:
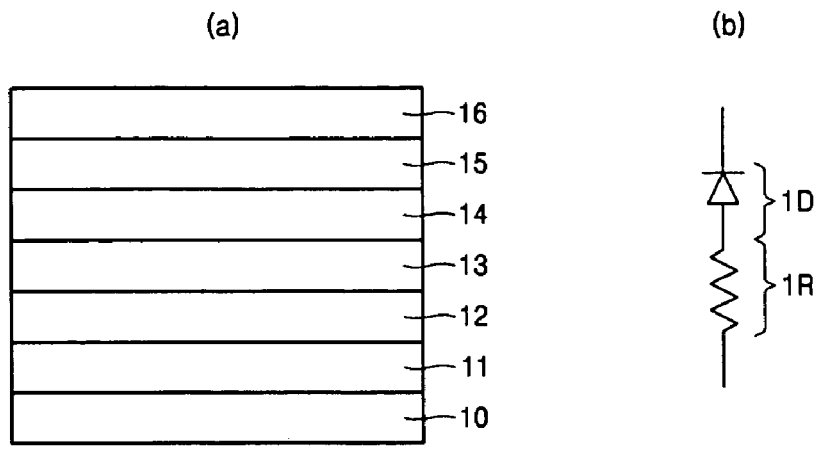
FIG. 1A illustrates a nonvolatile memory device including one resistor and one diode according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

A nonvolatile memory device including one or more resistors and one or more diodes according to the present invention will now be described more fully hereinafter with reference to the accompanying drawings, in which example embodiments of the invention are shown.

FIG. 1A is a cross sectional view of a nonvolatile memory device including one resistor and one diode according to an example embodiment of the present invention.

Referring to FIG. 1A, the memory device includes a substrate 10, a lower electrode 11, a resistor structure including one or more resistance layers 12 and 13, a diode structure including one or more diode layers 14 and 15, and an upper electrode 16, which are sequentially stacked. In an example embodiment, the resistance layers 12 and 13 may function as a data storage portion. A first resistance layer 12 may act as a buffer layer and a second resistance layer 13 may act as a data storage layer. The first resistance layer 12, which acts as the buffer layer, may be optionally formed. The diode structure may be a p-n junction structure and include a first oxide layer 14 and a second oxide layer 15.

In an example embodiment, the substrate 10 may be a semiconductor substrate, for example, a Si substrate, that is used for a typical semiconductor device. The lower and upper electrodes 11 and 16 may be formed of a conductive material, for example a metal, that is typically used for an electrode of a semiconductor device. In an example embodiment, a material for the lower electrode 11 may be selectively determined according to the kind of material formed thereon. The first and second resistance layers 12 and 13 may be formed on the lower electrode 11. The first and second resistance layers 12 and 13 may be formed of transition metal oxide, for example, at least one of NiO, $TiO_2$, HfO, ZrO, ZnO, $WO_3$, CoO, and $Nb_2O_5$. The first and second resistance layers 12 and 13 may be formed of the same material, for example, NiO or different materials.

In an example embodiment, the first and second resistance layers 12 and 13 may include a chalcogenide.

For example, the first and second resistance layers 12 and 13 may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the first and second resistance layers 12 and 13 may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the first and second resistance layers 12 and 13 may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the first and second resistance layers 12 and 13 is described above as being formed primarily of ternary phase-change chalcogenide alloys, the chalcogenide alloy of the first and second resistance layers 12 and 13 could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the first and second resistance layers 12 and 13 may also be formed of transition metal oxide that includes at least one material of nickel oxide (NiO), titanium oxide ($TiO_2$), hafnium oxide (HfO), niobium oxide ($Nb_2O_5$), zinc oxide (ZnO), zirconium oxide ($ZrO_2$), tungsten oxide ($WO_3$), cobalt oxide (CoO), GST ($Ge_2Sb_2Te_5$), and PCMO ($Pr_xCa_{1-x}MnO_3$).

The first oxide layer 14 may be formed of p-type oxide and the second oxide layer 15 may be formed of n-type oxide or vice versa. For example, the first and second oxide layers 14 and 15 may be formed of transparent metal oxide with a controlled fraction of oxygen. The transition metal oxide may have an electrical characteristic, which varies with the amount of oxygen combined with transition metal. The first and second oxide layers 14 and 15 may be formed of the same material as the second resistance layer 13, but they may exhibit a p-type semiconductor characteristic or an n-type semiconductor characteristic by increasing a fraction of oxygen more than the second resistance layer 13. In an example embodiment, the first oxide layer 14 and the second oxide layer 15 may be referred to a p-type oxide layer 14 and an n-type oxide layer 15, respectively.

Figure 1B:
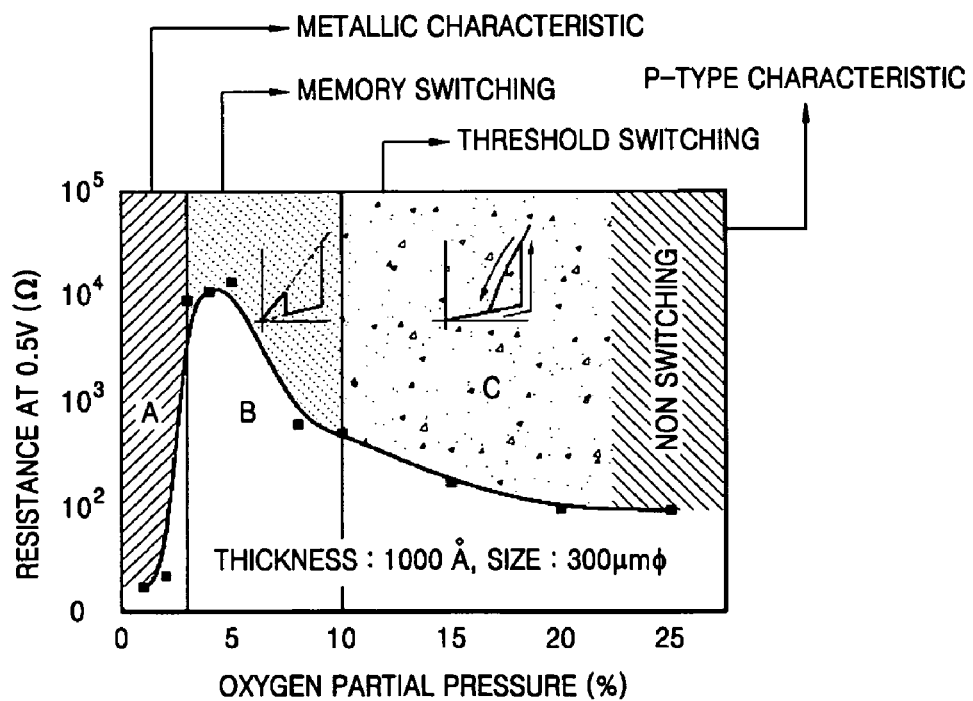
FIG. 1B is a graph showing characteristics of materials used for the nonvolatile memory device including one resistor and one diode as shown in FIG. 1A.

FIG. 1B is a graph showing characteristics of materials used for the nonvolatile memory device including one resistor and one diode as shown in FIG. 1A. In an example embodiment, FIG. 1B shows a variation in resistance with respect to a fractional oxygen partial pressure for the formation of NiO.

Referring to FIG. 1B, when a fraction of oxygen in NiO is low (region "A"), NiO is similar in characteristics to Ni. However, as the fraction of oxygen increases (region "B"), resistance increases, thus showing a switching characteristic. As the fraction of oxygen further increases (region "C"), resistance decreases, thus showing a semiconductor characteristic. Any one of the resistance layers 12 and 13, the p-type oxide layer 14, and the n-type oxide layer 15 may be formed of transition metal oxide, for example, NiO, with a controlled fraction of oxygen. In a manufacturing process, the resistance layers 12 and 13, the p-type oxide layer 14, and the n-type oxide layer 15 may be sequentially formed in-situ by depositing the same transition metal on a sample using, for example, sputtering while controlling the amount of oxygen gas injected into a reaction chamber. In other example embodiments, other of the above-described transition metal oxides and combinations thereof may exhibit similar characteristics.

Figure 2:
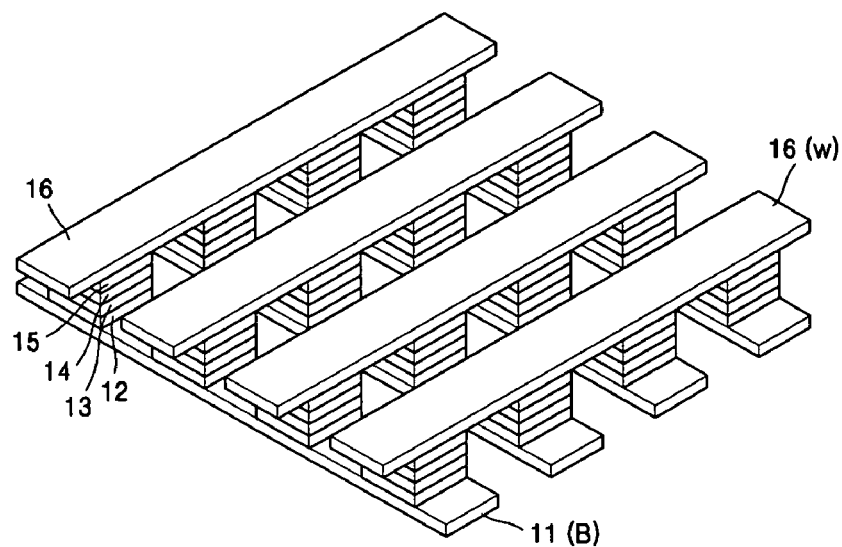
FIG. 2 illustrates an array structure of the nonvolatile memory device including one resistor and one diode as shown in FIG. 1A.

FIG. 2 illustrates an array structure of the nonvolatile memory array including one resistor and one diode as shown in FIG. 1A.

Referring to FIG. 2, a plurality of lower electrodes 11 are disposed at regular intervals, and a plurality of upper electrodes 16 are disposed across the lower electrodes 11. Also, resistance layers 12 and 13 and a p-n junction diode structure 14 and 15 are formed at each of the intersections of the lower electrodes 11 and the upper electrodes 16.

Figure 3:
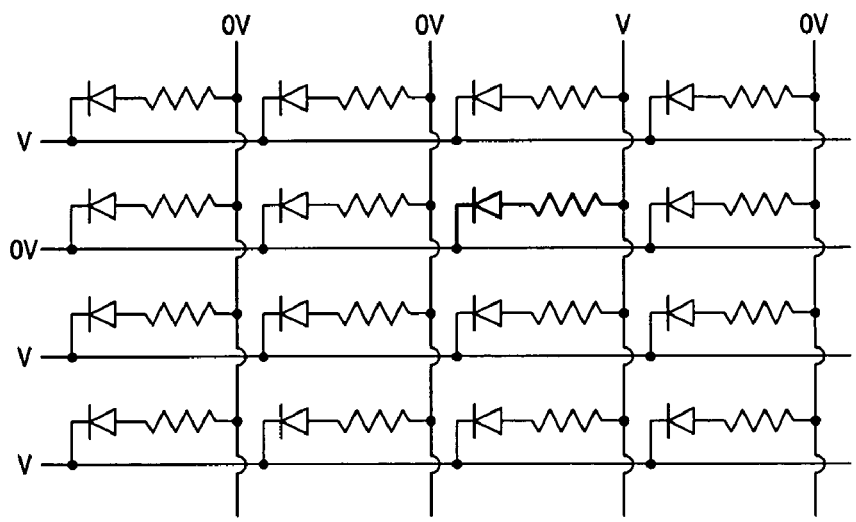
FIG. 3 is an equivalent circuit diagram of the array of the nonvolatile memory device including one resistor and one diode as shown in FIG. 2.

FIG. 3 is an equivalent circuit diagram of the array of the nonvolatile memory device including a resistor and a diode as shown in FIG. 2.

Figure 4:
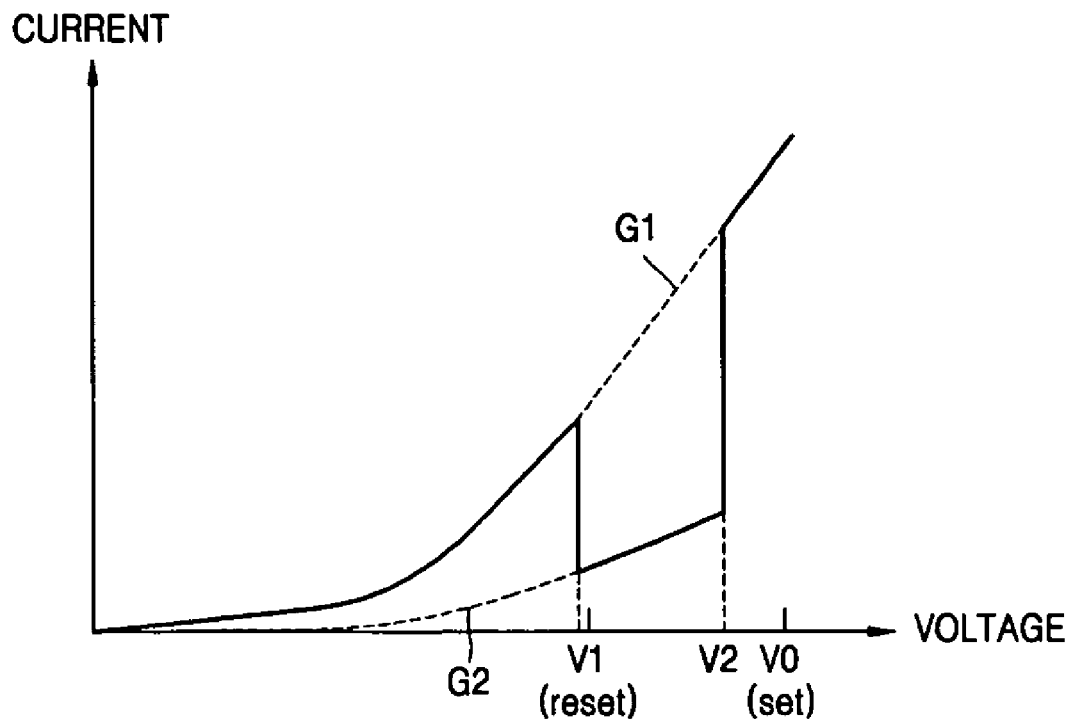
FIG. 4 is a graph showing operating characteristics of the nonvolatile memory device including one resistor and one diode as shown in FIG. 1A.

The electrical characteristics of the second resistance layer 13 of the nonvolatile memory device including a resistor and a diode according to an example embodiment of the present invention will be described with reference to FIG. 4. In FIG. 4, a horizontal axis refers to voltage applied through the upper and lower electrodes 16 and 11, respectively, and a vertical axis refers to current that passes through the second resistance layer 13.

FIG. 4 shows two current-voltage curves G1 and G2. The curve G1 shows a case where the resistance of the second resistance layer 13 is lowered, that is, current that passes through the second resistance layer 13 is higher for the same voltage. By comparison, the curve G2 shows a case where the resistance of the second resistance layer 13 is elevated, that is, current that passes through the second resistance layer 13 is lower for the same voltage. In an example embodiment of the present invention, the semiconductor memory device including one resistor and one diode makes use of different current-resistance characteristics, as will now be described in detail.

At the outset, when applied voltage is gradually increased from 0V to 1V, current may increase in proportion to the voltage along the curve G1. However, with the application of V1, current may be reduced and varied along the curve G2. This phenomenon continues in the range of $V1 \leq V \leq V2$. Also, when voltage is applied in the range of V2<V, current increases along the curve G1 again. In an example embodiment, resistance in the curve G1 may be referred to as a first resistance and resistance in the curve G2 may be referred to as a second resistance. That is, it can be seen that the resistance of the second resistance layer 13 sharply increases in the range of $V1 \leq V \leq V2$.

Also, a nonvolatile memory device including one resistor and one diode according to example embodiments of the present invention may have one or more of the following characteristics. Initially, after a voltage is applied in the range of $V1 \leq V \leq V2$, when voltage is applied in the range of V<V1, current is detected based on the curve G2. After a voltage is applied in the range of V2<V, when voltage is applied in the range of V<V1, current is detected based on the curve G1. Accordingly, the nonvolatile memory device according to example embodiments of the present invention can properly operate using the above-described characteristics.

That is, in the nonvolatile memory device including one resistor and one diode according to example embodiments of the present invention, when voltage is applied in the range of V2<V through the lower and upper electrodes 11 and 16, the first resistance may be stored in the second resistance layer 13. When voltage is applied in the range of $V1 \leq V \leq V2$, the second resistance may be stored in the second resistance layer 13. By applying a voltage less than V1 and reading a current value, a state of memory stored in the second resistance layer 13 can be read.

Figure 5:
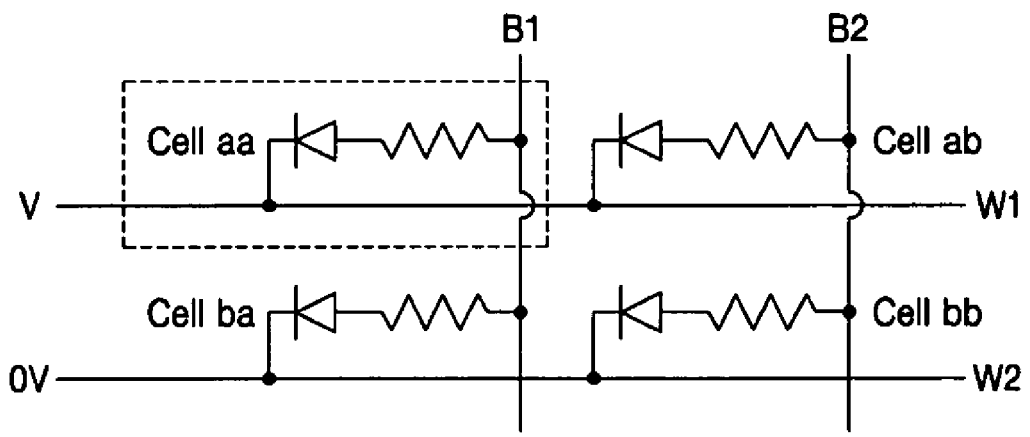
FIG. 5 is a diagram for explaining the operating principle of the nonvolatile memory device including one resistor and one diode as shown in FIGS. 2 and 3.

FIG. 5 is a diagram for explaining the operating principle of the nonvolatile memory device including one resistor and one diode as shown in FIGS. 2 and 3. FIG. 5 illustrates four memory cells 'aa', 'ab', 'ba', and 'bb', and each of bit lines B1 and B2 and word lines W1 and W2 is shared by a pair of cells.

A process of storing the first resistance (of the curve G1 of FIG. 4) in the second resistance layer 13 may be referred to as a program process (set), and a process of storing the second resistance (of the curve G2 of FIG. 4) in the second resistance layer 13 may be referred to as an erase process (reset).

In order to store the first resistance in the cell 'aa' of FIG. 5, a voltage of V2 or higher may be applied. For this operation, a voltage of V0 (V2<V0) may be applied to the bit line B1 and the word line W2. In this case, the cells 'ab' and 'ba' do not operate because there is no difference in electric potential between the upper and lower electrodes. Also, the cell 'bb' does not operate because a reverse voltage is applied thereto. Therefore, the first resistance is stored only in the cell 'aa'.

Thereafter, in order to store the second resistance in the cell 'aa', a voltage of V1≦V≦V2 may be applied. For this operation, a voltage of V1≦V≦V2 may be applied only to the bit line B1 and the word line W2, and the bit line B2 and the word line W1 are grounded. Accordingly, the first resistance is erased from the second resistance layer 13 of the cell 'aa' and the second resistance is programmed in the second resistance layer 13. The first resistance may be designated as '0' and the second resistance may be designated as '1,' and the reverse designation is also possible.

Further, a resistance state of the second resistance layer 13 that is a data storage layer of the cell 'aa' can be read using a current value that is measured by applying a voltage Vr less than V1 to the cell 'aa'. In this case, the voltage Vr may be applied only to the bit line B1 and the word line W2 as described above, it is determined whether the measured current corresponds to the curve G1 or the curve G2 of FIG. 4, and stored data is read.

Example embodiments of the present invention may have one or more of the following advantages.

A unit cell structure of a nonvolatile memory device according to example embodiments of the present invention may include one diode and one resistor, which are sequentially stacked. As a result, the nonvolatile memory device and an array cell structure thereof may be structurally simple.

A nonvolatile memory device according to example embodiments of the present invention may be formed using conventional DRAM manufacturing processes. Unlike a memory device including a typical switching device, a resistance layer and a diode structure formed thereon can be formed in-situ by controlling a fraction of oxygen. As a result, the manufacture of a nonvolatile memory device according to example embodiments of the present invention may be simple, so that productivity is increased and/or the cost of production is lowered.

Data can be simply stored and/or reproduced using materials with unique characteristics, thus enabling devices operating at higher speed.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A nonvolatile memory device comprising:
   a lower electrode;
   a resistor structure including a data storage layer disposed on the lower electrode, the data storage layer including at least one of NiO, TiO$_2$, HfO, ZrO, ZnO, WO$_3$, CoO, and Nb$_2$O$_5$;
   a diode structure disposed on the resistor structure, the diode structure including
      a first oxide layer disposed on the resistor structure, and
      a second oxide layer disposed on the first oxide layer; and
   an upper electrode disposed on the diode structure.

2. The device according to claim 1, wherein the first oxide layer is formed of p-type oxide and the second oxide layer is formed of n-type oxide.

3. The device according to claim 2, wherein any one of p-type oxide and n-type oxide is formed of at least one of NiO, TiO$_2$, HfO, ZrO, ZnO, WO$_3$, CoO, and Nb$_2$O$_5$.

4. The device according to claim 1, wherein the resistor structure includes one resistor and the diode structure includes one diode.

5. The device according to claim 1, wherein the resistor structure includes a chalcogenide.

6. The device according to claim 1, wherein the resistor structure includes a buffer layer between the lower electrode and the data storage layer.

7. The nonvolatile memory device of claim 1, wherein at least one of the first oxide layer and the second oxide layer are formed at an oxygen partial pressure of about 3 percent to about 10 percent.

8. A nonvolatile memory device comprising:
   a lower electrode;
   an array of a nonvolatile memory device, the array comprising:
      at least two bit lines arranged at regular intervals on a substrate;
      at least two word lines arranged at regular intervals and disposed across the bit lines;
      a resistor structure including a data storage layer disposed on the bit lines at each of the intersections of the bit lines and word lines, the data storage layer including at least one of NiO, TiO$_2$, HfO, ZrO, ZnO, WO$_3$, CoO, and Nb$_2$O$_5$; and
      a diode structure disposed in contact with the resistor structure and the word lines, the diode structure including
         a first oxide layer disposed on the resistor structure, and
         a second oxide layer disposed on the first oxide layer.

9. The array according to claim 8, wherein the first oxide layer is formed of p-type oxide and the second oxide layer is formed of n-type oxide.

10. The array according to claim 9, wherein any one of p-type oxide and n-type oxide is formed of at least one selected from the group consisting of NiO, TiO$_2$, HfO, ZrO, ZnO, WO$_3$, CoO, and Nb$_2$O$_5$.

11. The array according to claim 8, wherein the resistor structure includes one resistor and the diode structure includes one diode.

12. The array according to claim 8, wherein the resistor structure includes a chalcogenide.

13. The array according to claim 8, wherein the resistor structure includes a buffer layer between the at least two bit lines and the data storage layer.

14. A method of manufacturing a nonvolatile memory device comprising:
   forming a lower electrode on a substrate;
   forming a resistor structure including a data storage layer on the lower electrode, the data storage layer including at least one of NiO, TiO$_2$, HfO, ZrO, ZnO, WO$_3$, CoO, and Nb$_2$O$_5$;
   forming a diode structure on the resistor structure, the diode structure including
      a first oxide layer disposed on the resistor structure, and a second oxide layer disposed on the first oxide layer; and forming an upper electrode on the diode structure.

15. A nonvolatile memory device manufactured in accordance with the method of claim 14.

16. The method of manufacturing a nonvolatile memory device according to claim 14, wherein the resistor structure includes a buffer layer between the lower electrode and the data storage layer.

17. The method of claim 14, wherein forming the diode structure includes forming the first oxide layer and the second oxide layer at an oxygen partial pressure of about 3 percent to about 10 percent.

18. A method of manufacturing an array of nonvolatile memory devices comprising:
   forming at least two bit lines on a substrate, arranged at regular intervals;
   forming one or more resistor structures including a data storage layer on the at least two bit lines at desired locations, the data storage layer including at least one of NiO, $TiO_2$, HfO, ZrO, ZnO, $WO_3$, CoO, and $Nb_2O_5$;
   forming a diode structure on each of the one or more resistor structures, the diode structure including
      a first oxide layer disposed on the resistor structure, and
      a second oxide layer disposed on the first oxide layer; and
   forming at least two word lines arranged at regular intervals and disposed across the at least two bit lines; the at least two bit lines and the at least two word lines intersecting at the desired locations, the at least two bit lines and the at least two word lines being electrically connected via the one or more resistor and diode structures.

19. An array of nonvolatile memory devices manufactured in accordance with the method of claim 18.

20. The method of manufacturing an array of nonvolatile memory devices according to claim 18, wherein the resistor structure includes a buffer layer between the at least two bit lines and the data storage layer.

21. A nonvolatile memory device comprising:
   a lower electrode;
   a resistor structure including a data storage layer on the lower electrode, the data storage layer including at least one of NiO, $TiO_2$, HfO, ZrO, ZnO, $WO_3$, CoO, and $Nb_2O_5$;
   a diode structure configured to supply a current to the data storage layer in one direction, the diode structure including
      a first oxide layer on the resistor structure, and
      a second oxide layer on the first oxide layer; and
   an upper electrode disposed on the diode structure.

* * * * *